(12) United States Patent
Ottesen et al.

(10) Patent No.: US 6,281,676 B1
(45) Date of Patent: Aug. 28, 2001

(54) RIGID DISK SURFACE DEFECT DETECTION AND CLASSIFICATION

(75) Inventors: Hal Hjalmar Ottesen; Gordon James Smith, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/209,197

(22) Filed: Dec. 10, 1998

(51) Int. Cl.[7] ............................. G01R 33/12; G11B 27/36
(52) U.S. Cl. ............................... 324/212; 360/25; 714/42
(58) Field of Search .............................. 324/210, 212; 360/135; 714/42

(56) References Cited

U.S. PATENT DOCUMENTS 4,498,146 * 2/1985 Martinez ............................. 364/900
5,935,261 * 8/1999 Blachek et al. ....................... 714/42

FOREIGN PATENT DOCUMENTS

363317748A * 12/1988 (JP) ........................... G01N/21/88

* cited by examiner

Primary Examiner—Hezron Williams
Assistant Examiner—Henry S. Andersen
(74) Attorney, Agent, or Firm—Robert W. Lahtinen; James R. Nock

(57) ABSTRACT

The disclosure is directed to a method for identifying and classifying data surface defects on the disks of a rigid disk data storage device. By partitioning each surface into cells and sub-sampling every Nth track, the number and location of defects can be determined. The number of stored defects is then examined to determine whether clusters of contiguous cells exist wherein defect totals exceed a predetermined threshold number. This enables the location of clusters on multiple surfaces to be examined for axial alignment, radial alignment or random occurrence as an indication of the source of damage. To obtain further verification of the data surface condition, the location of a defect cluster can be scanned using a utility that evaluates each track within the defect cluster or area. The simplicity of the test technique not only reduces manufacturing test time and dispenses with elaborate test equipment, but also allows implementation in the device microcode with the result that it may be invoked at any time enabling defect identification and analysis by the device integrator and end user in addition to the manufacturer.

13 Claims, 8 Drawing Sheets

RIGID DISK SURFACE DEFECT DETECTION AND CLASSIFICATION

FIELD OF THE INVENTION

The invention pertains to the detection of defects on data surfaces of rigid disk drives and more particularly to the detection and classification of defects to first determine whether a threshold number of defects has been exceeded and secondly, determine the type of damage by examining the occurrence and location of defect clusters.

BACKGROUND OF THE INVENTION

In the highly competitive disk drive industry, there is a continuing effort to reduce cost including the manufacturing cost, but not at the expense of reliability and quality. A vital element of the testing to assure quality, performance and reliability is the disk surface analysis to assure the flatness necessary to permit transducer heads to fly over the surface at a height of 1.8 microinches as well as evaluating the magnetic integrity of the data storage tracks.

Surface analysis testers, like the harmonic ratio flyheight (HRF) test, have been a common test procedure. The HRF glide testing is used to detect the presence or absence of mechanically protruding surface defects that interfere with the head/slider. The HRF test is effective, but requires expensive external testers that are typically placed in the manufacturing clean rooms. The HRF process samples every Nth track, called here subsampling, and determines the presence or absence of protruding defects. The subsampling used for HRF is typically every 30th to 40th track with the subsampling period less than the minimum rail width on a slider. The HRF test is an expensive low bandwidth instrumentation system that requires separate manual handling of each disk drive. Due to the smaller air bearings of future sliders and increased rotational velocity, rail contact time with a protruding defect is much shorter and the signal suggesting a defect is much shorter. This means that the HRF system needs a much higher bandwidth for reliable detection, which will make the HRF system even more expensive. Further, the thermal response of the current state of the art magnetoresistive (MR) heads can not be used since future very high speed disk drive recording bandpass channels are AC coupled with lower edge frequency set to about 5 MHz which effectively blocks the thermal response. Accordingly, a surface analysis test method is sought that will replace the HRF based method without sacrificing the reliability and quality of the disk drives being produced while lowering cost.

SUMMARY OF THE INVENTION

The present invention provides a quick, reliable, and low cost disk drive surface analysis method that is in-situ to the drive. The method of the invention quickly scans each disk surface of a hard disk drive for major clusters of defects followed by a classification of the defect clusters to determine whether they were caused by mechanical contact or not. The algorithm is simple enough to permit storage in the drive microcode. The method is not limited to manufacturing, but can also be used, for example, as a post shipping test for identifying surface damage that may have occurred during transportation, or by the user to determine the disk surface integrity status of the disk drive at any time. Thus the method can be used in manufacturing to decide if disk surface damage is caused by merge or demerge damage, system integrators can find whether surface damage was caused during shipping and the user can learn whether an accidental event caused any serious disk surface damage.

The in-situ surface analysis test method or self-glide test (SGT) searches for large clusters of surface defects rather than individual surface defects. It also determines whether the clusters have cylindrical adjacency (collateral damage) for drives with two or more data surfaces to suggest the presence of handling damage or assembly damage. Large clusters of surface defects are commonly associated with protruding defects. The SGT uses information similar to the information stored in the listings obtained during a surface analysis test (SAT). Once a cluster is found, the generalized error measurement facility (GEM) in the recording channel can conduct HRF-like measurements over the defect for additional verification.

DETAILED DESCRIPTION

Figure 1:
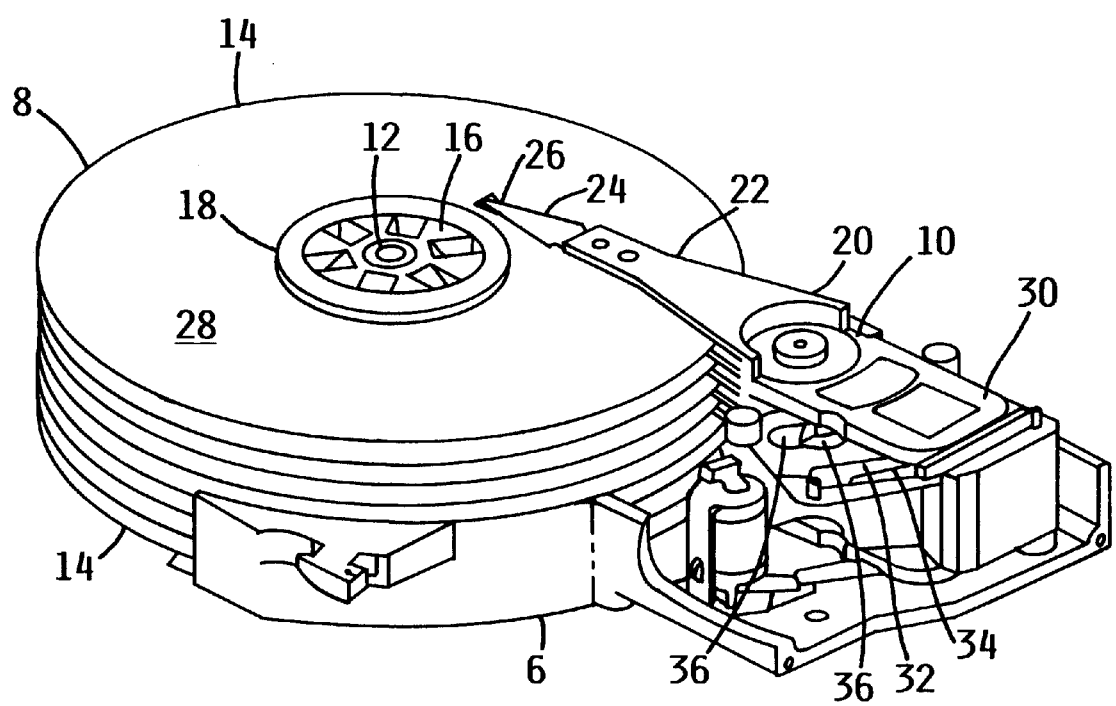
FIG. 1 illustrates a typical rigid disk data storage device with the cover removed and part of the base or frame broken away.

FIG. 1 illustrates a typical rigid disk drive data storage device with the cover and part of the frame or base 6 removed to show the disk stack assembly 8 and the rotary actuator assembly 10. The spindle shaft 12 forms a part of the wound stator of the spindle motor that rotates the disks 14. The hub 16 forms the spindle motor rotor and has axially spaced disks 14 mounted concentrically therearound and clamped in position by a shrink ring 18 so that hub and disk stack rotate in unison. The actuator rotor 20 has a series of arms 22 that extend over each axial end surface of the disk stack and between each pair of confronting disk surfaces and respectively carry suspensions 24 that support a transducer 26 to write data on and read data from the confronting disk surface. Diametrically opposite arms 22, arms 30 support a voice coil. A stator 32 mounted on base 6 is formed of magnetically permeable material, supports permanent magnets 34 and presents air gaps 36 across which the permanent magnets induce a flux field. The rotor voice coil, positioned in the air gaps 36, is pulsed by a current to drive the actuator rotor 20 in one pivotable direction and is pulsed in the opposite direction to drive the actuator rotor 20 in the opposite of such one pivotable direction to cause a transducer to access and follow an addressed data track on the disk data surface.

Each disk data surface presents a band of coaxial and circumferential data tracks each of which includes a series of radial sector boundaries. In the example of FIG. 1, the band of tracks on each surface includes 8200 tracks with each track including ninety sectors. To practice the method of the present invention, each data surface is partitioned into cells which include a band of contiguous data tracks and extend circumferentially for one sector. The self glide test (SGT) example uses a sampling rate of every Nth track for writing data on the track, reading the track, sensing defects and recording the defects identified with respect to the cell within which each defect is located, The precise sampling rate depends on the tracks per Inch (tpi) track density and width of the transducer head air bearing surface. The results of the sampling are evaluated to determine whether a surface includes cells with defects exceeding a threshold number and further whether clusters of such cells exist which adjoin one another either radially or circumferentially. The occurrence of clusters of defective cells on a single surface and axially aligned on adjacent data surfaces provide reliable information as to whether a drive must be rejected and reworked and can also reveal the source of the damage such as a protrusion on a disk surface; merge or demerge damage as the actuator is assembled to the stack of disks during manufacture; or a shock to which the drive was exposed during manufacture, transport or use. The use of the test beyond the manufacture of the drive is enabled by the simplicity of the test algorithm that permits inclusion in the drive microcode which makes it available not only during manufacture, but also to the equipment integrator and the user.

Figure 2:
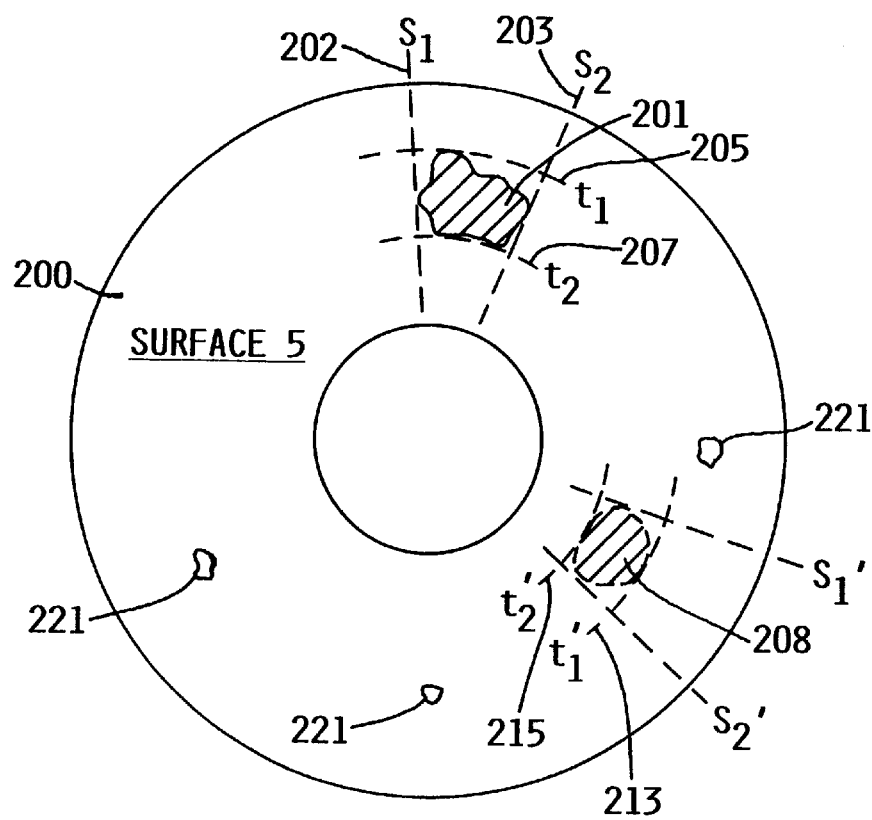
FIG. 2 is a graphical showing of a disk surface and the registers recording the location and extent of defect clusters as utilized in the present invention.
Figure 2:
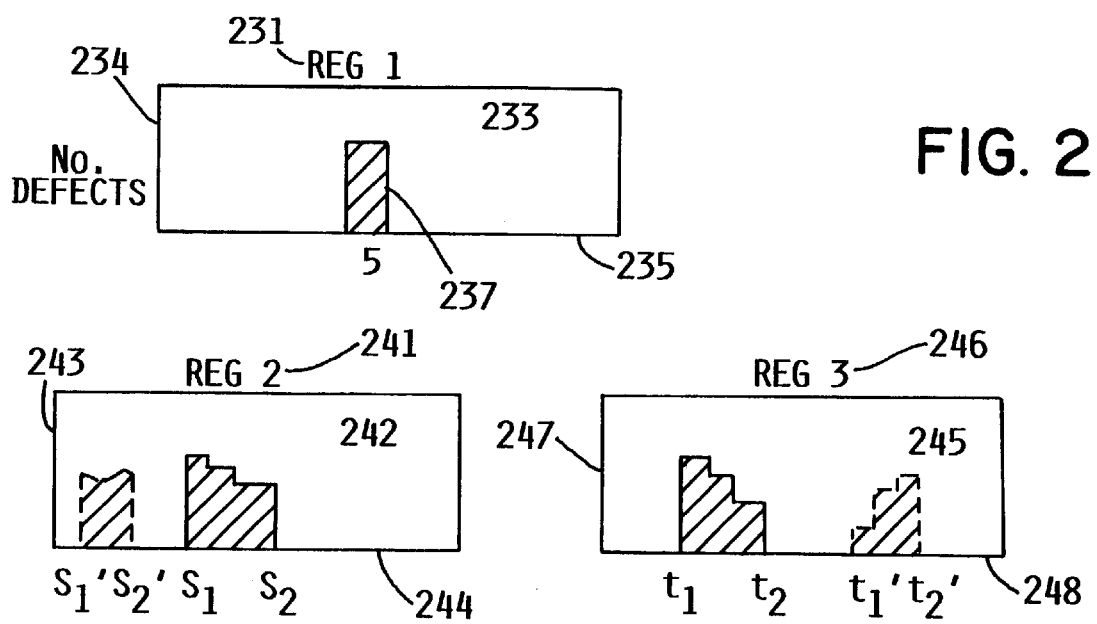

In FIG. 2, the 5th disk surface 200 of the drive of FIG. 1, is shown. On this surface there are two major defect clusters. One defect cluster 201 is located between sector S1, 202 and sector S2, 203. The cluster 201 also lies between track zone t1, 205 and t2, 207. Another defect cluster 208 is between track zones t1', 213 and t2', 215. The disk surface 200 also contains other spurious SAT defects 221 that have a size smaller than csize (i.e., the minimum cluster screen size). These small defects are important in the following explanation. The contents of REG1 231 is shown as a bar chart 233. REG1 shows the sum of defects in the bar 237 for the 5th disk surface 200. The vertical axis 234 is the defect count and the horizontal axis 235 is the surface or head number. In REG2 241, which accumulates the defect counts by sector, the bar chart 242 shows cluster 201 between sectors S1 and S2. In bar chart 242 the vertical axis 243 is the number of defects and the horizontal axis 244 is the sector number, Cluster 208, on the other hand, shows up in 242 between S1' and S2'. Lastly, for REG3 246, which accumulates the track zone defect count, the bar chart 245 shows the cluster 201 appearing between track zones t1 and t2 and cluster 208 between t1' and t2'. In the bar chart 245, the vertical axis 247 shows the defect count and the horizontal axis 248 is the track zone. By inspection of FIG. 2, one can grasp the meaning and purpose of REG1, REG2, and REG3, The in-situ SGT surface analysis test is shown in more detail in FIG. 3 and will be described in detail following some preliminary information. The algorithm used in the SGT, disclosed in this invention, has several advantages, the most important of which is that it can reside in onboard disk drive microcode that can be activated anytime during the useful life of the disk drive. In the description, the eight-disk drive of FIG. 1 is used as an example.

In the example, the eight-disk, sixteen-surface drive of FIG. 1 is used as an example. The SGT algorithm simulates the flow diagram shown in FIG. 3. The algorithm is also referred to as the Second Look Algorithm (SLA) in that it always takes a second look (a second scan) to verify a glide defect, The function called SecLook.m has syntax SecLook (SAT,sub,csize) Here, SAT is any defect list obtained from disk drive testing, sub is how much subsampling is used, and csize is the minimum cluster-screen size., In the examples used, it is assumed that the sampling is sub=25 (every 25th track sampled) and the minimum cluster size is csize=100 SATsites. A single SAT-site is defined as one single track within one single sector on one single surface. Each disk surface has 90 sectors per track and about 8200 tracks or 90×8200=738,000 SAT-sires. Current manufacturing tests allow the disk drive to have no more than 2,000 SAT-sites per surface if the SAT-sites are not clustered. Clusters are usually associated with mechanical or nonmechanical surface damage. For process time calculations, it has been assumed that the disk drive spindle rotates at 7,200 RPM, The time required to seek 25 tracks, write one track, and read it back is 20 milliseconds, while seeking 25 tracks and reading it takes 12 milliseconds.

The SGT process algorithm basically includes three surface scans. For scan 1, every Nth (25th) track is written and subsequently read back on each surface. Defective SAT-sites are recorded and stored in three registers: $REG1(i)$, (head); $REG2(j)$, (sector); and $REG3(k)$, (track zone). At a sub-sampling rate of every 25th track, this scan takes 6.56 seconds per surface. Scan 2, based on the results of the register contents from scan 1, is a second shorter and focused cluster scan identifies the size of the largest cluster site above the screen level csize on a surface. All pertinent information, like head, start cylinder, end cylinder, sector, and cluster size, is stored in the largest cluster table 260. Scan time is usually less than ½ second for surfaces that contain clusters. Scan 3, the conditional collateral scan 280 is then used to analyze the largest cluster table 260. If clusters larger than screen level are found on two or more surfaces following scanning of the whole disk pack during the two previous scans, a third short and focused scan is initiated where surfaces identified with clusters are physically tested for axial alignment. If there is no axial alignment, then a further test, such as the generalized error measurement (GEM) facility of the recording channel may be employed for verification of protruding defects. The scan time here will usually be less than 10 seconds.

Figure 3A:
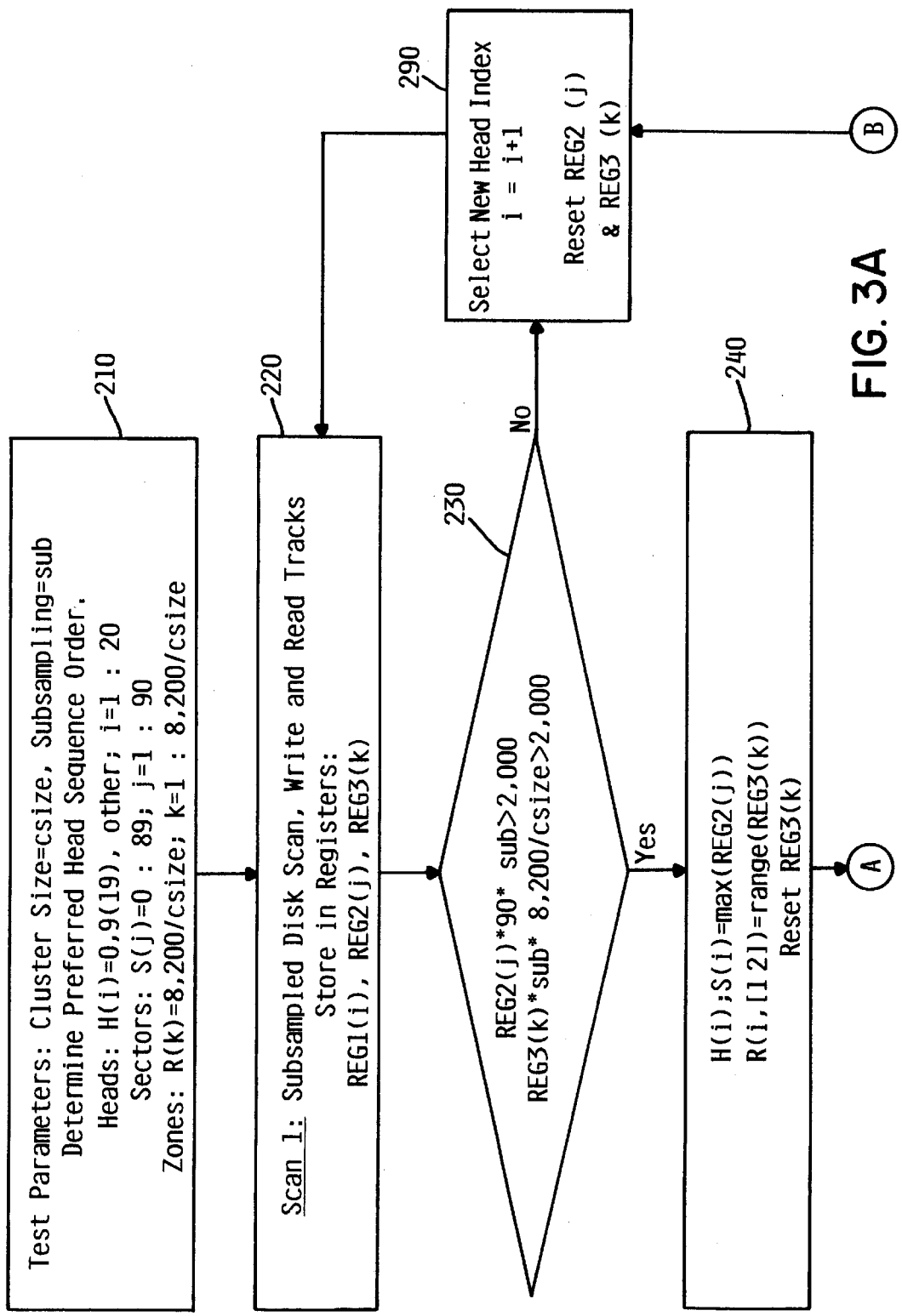
FIG. 3 is a flow diagram showing the sequence of steps employed in practicing the present invention.
Figure 3B:
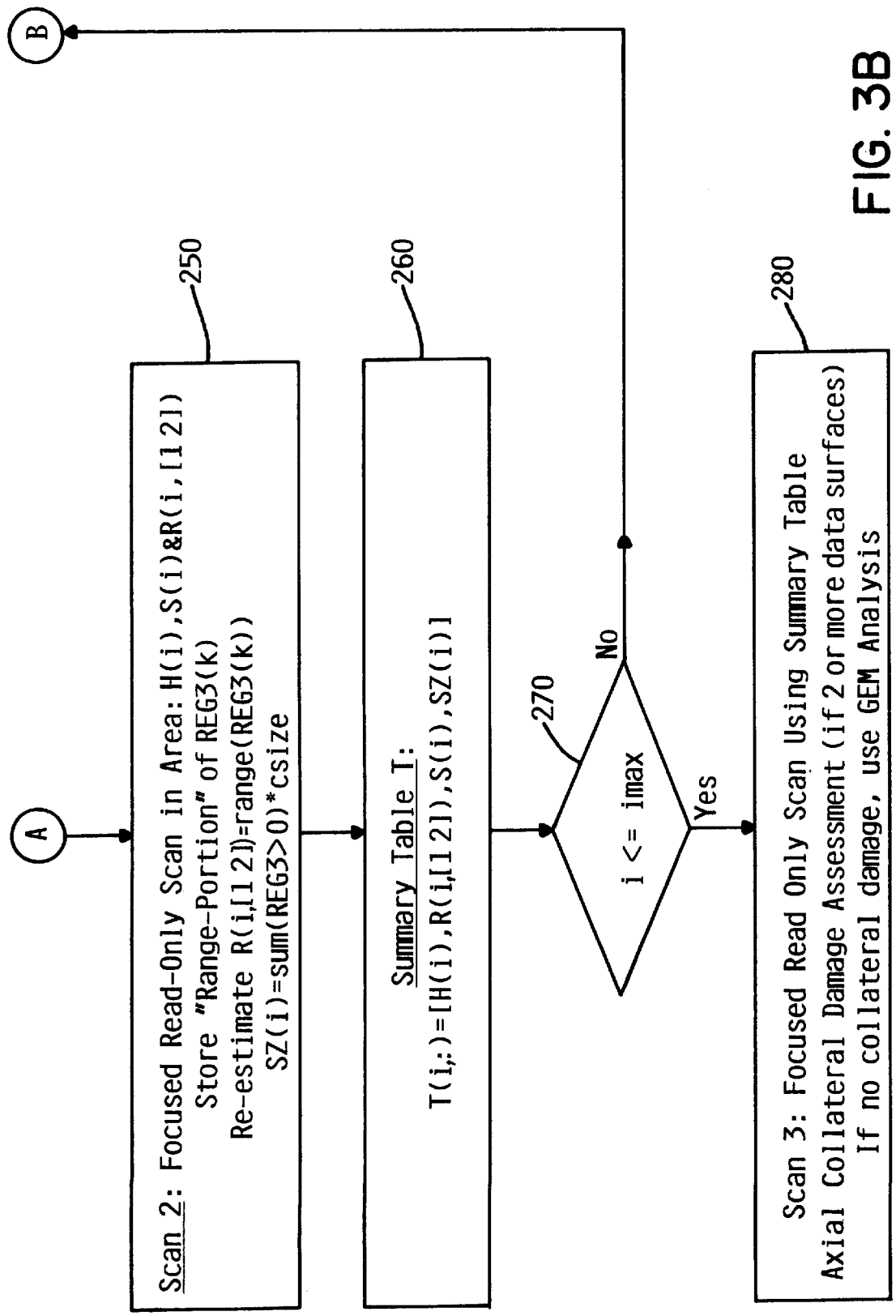

The cluster algorithm is shown in the flow-diagram of FIG. 3. Referring to block 210, where test sequencing and indexing are initialized, it is to be noted that the sequence in which the heads are rested may not be sequential. Experience shows that a higher probability of finding defective SAT-sites exists at the outside pack surfaces, i.e., head numbers 0 and 15 in the eight disk drive of the example. Previously replaced or reworked surfaces or disks may be tested first. If any of these replaced surfaces are bad and earlier information is available, the disk drive may go back for rework or be discarded. The surface tracks are grouped into buckets (zones) of csize each. The number of zones for the drive of the example and shown in FIG. 1, with csize=100 is 82.

The first unconditional scan is done at block 220. Here every Nth track is written followed by a read and any defective SAT-sites are recorded. The SAT-site information is distributed simultaneously (jointly) into three registers. The first register $REG1(i)$ contains the total number of SAT-sites per surface, and its size is only 16 words. The circumferential distribution along the sectors is stored in $REG2(j)$ which has 90 words. Finally, register $REG3(k)$ stores the radial distribution along the sectors and has a length of 8,200/csize words, where csize is the threshold for the minimum cluster size. In the drive of the example, if csize=100 then the size is 82 words.

Where there is an upper limit of 2000 defective SAT-sites per surface, each cell in $REG1(i)$ will be tested against that limit. Assuming a random distribution of SAT-sites across any surface, then corresponding failure limits can be established for REG2(j) and REG3(k). Shown in block 230, these limits are REG2(j)*sub*90>2000 and REG3(k)*sub*8,200/ csize>2000 respectively. If the limits are not exceeded, a new surface is selected in block 290 and a new scan is performed in block 220. If one or both the limits are exceeded, the maximum cell, i.e., the sector S(i) with the most defective SAT-sites for head H(i) is found in REG2(j) by block 240, Furthermore, block 240 determines the contiguous range R(i, [1 2]) of neighboring zones (sub-sampled tracks) by processing the data in REG3(k). The parameter R(i, [1 2]) contains two values, the beginning zone and the ending zone of the contiguous SAT defect. A unique recursive algorithm using a median filter of successively larger window size accomplishes the range-estimation in an elegant way, This algorithm is described in detail in FIG. 4, discussed below. Finally, REG3(k) is reset to zero.

The recursive median filter operates on a thresholded vector of defect sites obtained from REG3. The vector, I3, is thus calculated by performing an element-by-element compare on REG3 elements in the following equation:

$$I3 = (ZONE\_LENGTH \times SUB \times REG3) > 2000 \quad [1]$$

In equation 1, ZONE_LENGTH is calculated by dividing the number of data tracks on a disk surface by the cluster screen size and rounding. I3 is therefore a vector of 0's and 1's indicating which zones have defects that exceed 2000 in estimated number.

Figure 4:
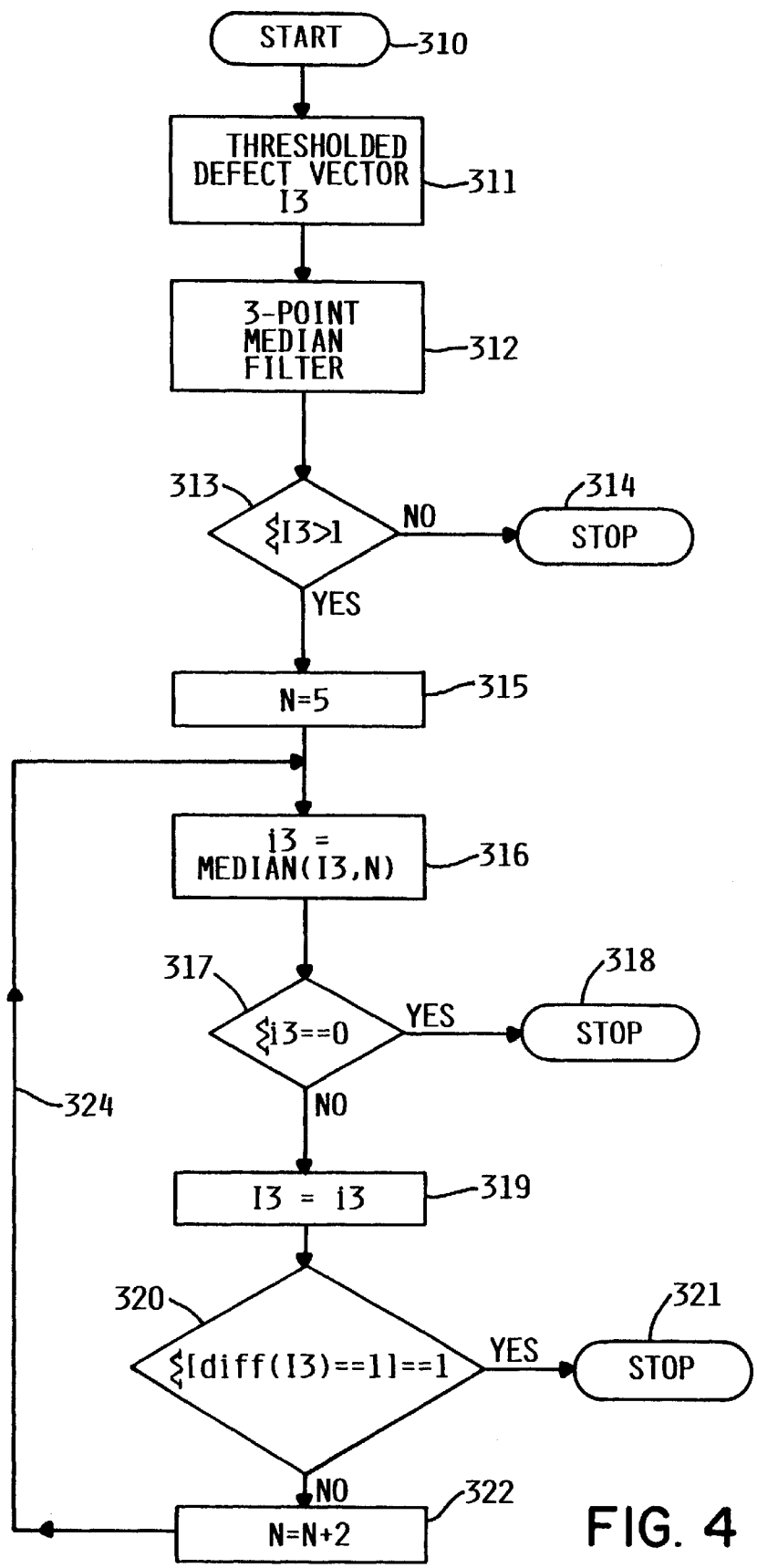
FIG. 4 is a flow chart illustrating logical steps of the recursive median filter which is used to identify the largest defect cluster within a defined area.

Now referring to FIG. 4, the recursive median filter begins at 310 and assumes the existence of a threshold defect vector, I3, in 311. A 3-point median filter 312 is initially used to determine if only spurious sites were present in I3. This check is performed in 313. If true, the operation stops (314). If sites remain, the median filter length is set to 5, in 315. A new vector, i3, is thus created at 316 and another check is made to see if all sites are contiguous at 317. If this is true, the operation is complete and is stopped at 318. If non-contiguous regions still exist, the original threshold vector I3 is assigned the value of i3 (also a vector) in 319. Another check is made at 320 to decide if all defects are adjacent. If so, the median filter operations are complete and the operation is stopped at 321. If non-contiguous regions still exist, the length of the median filter is increased by 2 at 322 to retain its odd-length feature and path 324 is taken to 316.

Figure 5:
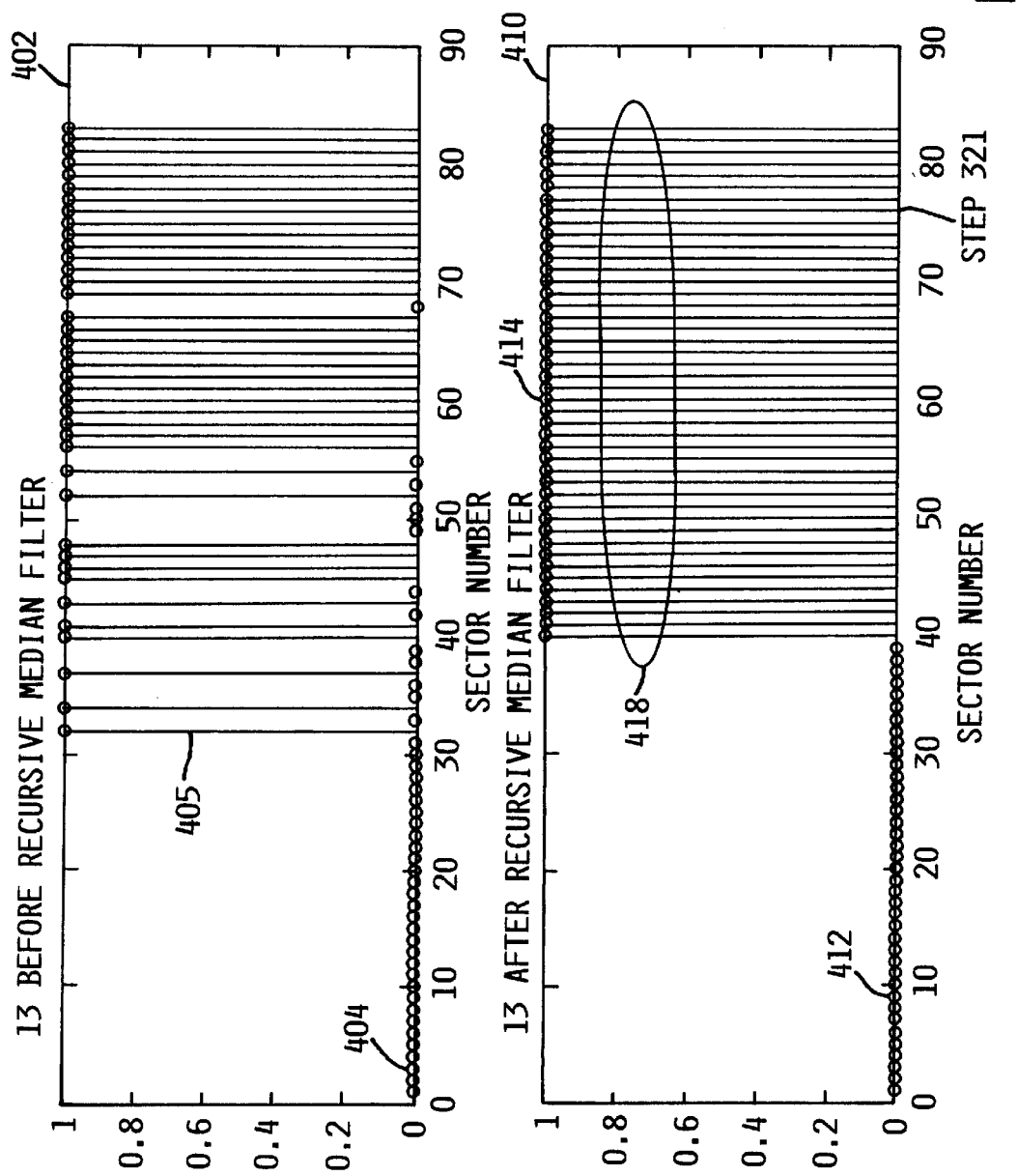
FIG. 5 is a graphical depiction illustrating the identification of the largest defect cluster within a partitioned area.

In FIG. 5, a graphical depiction of 13 before the adaptive median filter is applied is shown at 402. Zones where defects do not exceed the threshold are set to 0 by equation 1 at 404. Zones with defects exceeding the threshold are set to 1 at 405. It is desired to determine the largest contiguous zones of defects at 402. At 410, the result of the recursive median filtering is shown, Zones with non-contiguous defects are set to 0 at 412. Zones with contiguous defects are set to 1 at 414. The contiguous zone is at 418.

The conditional subsampled short scan done in block 250 covers only the range specified by R(i, [1 2]) and only the SAT data in max-sector S(i) is read stored in REG3(k). Again the recursive algorithm using a median filter of successively larger windows estimates the range. Once the new estimate of the defective range is determined, then the cluster size can be assessed. The accumulated results of the defect SAT-clusters exceeding csize for each surface, found in block 250, is stored in a largest-cluster table 260. The largest-cluster table 260 contains the pertinent information, like head, start zone, end zone, sector, and cluster size. The overall process (scan 1 and scan 2) is repeated, initiated by block 270, if there are more untested surfaces.

If the disk drive contains two or more data surfaces, the SGT algorithm proceeds to the collateral damage algorithm in block 280. This algorithm uses the birthday problem in probability theory as a reference. It can also be applied to the determination of the occurrence of axial collateral damage between disk drive surfaces. The problem statement here is, "What is the probability of the natural occurrence of two or more disk drive surfaces in the same disk drive have the same SAT-site location?". Each surface has 90 sectors and about 8,200 tracks. If a sampling of every 25 tracks is applied, then the corresponding probability of a SAT-site for the eight disk drive of FIG. 1 is less than one half of one percent. The fact that the natural axial collateral SAT-site cluster probabilities are so extremely low, allows for the very reliable detection of mechanical axial collateral surface damage using the proposed method. Block 280 simply uses the information stored in largest-cluster table 260, and physically tests each cluster-site recorded in the table against the other different surfaces in the table to determine axial collateral damage.

Figure 6:
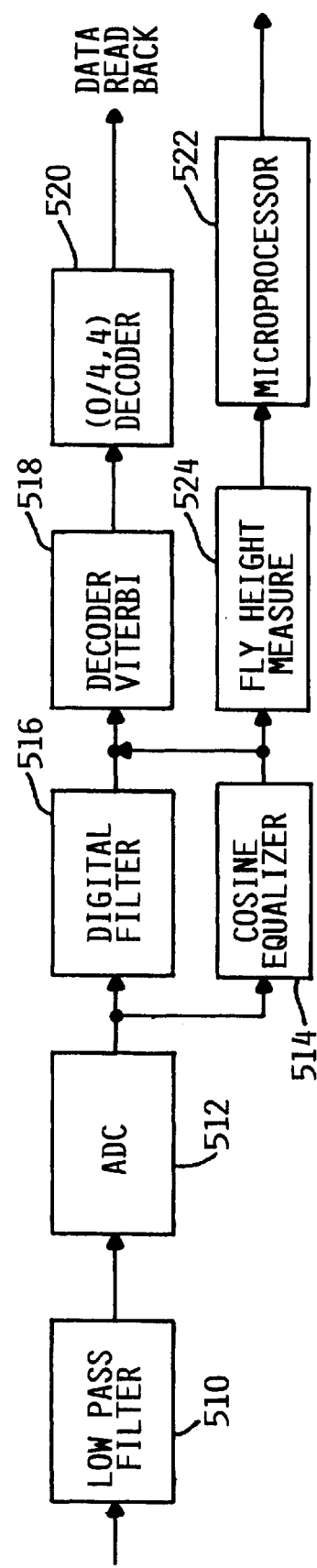
FIG. 6 is a diagram illustrating apparatus for fly height monitoring.

To provide further information and verification the cluster site may be examined in greater detail using an alternate test. The deflect cluster may be analyzed using the general error measurement (GEM) facility in the channel for fly height modulation detection, Referring to FIG. 6, an analog read signal obtained at the head disk interface is applied to a low pass filter 510 which may or may not provide equalization. The filtered read signal is converted to digital form by an analog to digital converter (ADC) 512 that provides 64 possible 6-bit sampled values. The 6-bit samples of the ADC 512 are applied to a cosine equalizer 514 that provides an adaptive frequency adjustment function. Either the equalized signal or the filtered signal from the cosine equalizer 514 or the digital filter 516, respectively is applied to a Viterbi decoder 518 coupled to a decoder 520 to complete the maxim-likelihood (ML) detection process for the data readback.

To monitor fly height, a number K, representative of the frequency adjustment provided by the cosine equalizer 514 for each transducer head, is available after a read to a microprocessor 522 to determine if frequency response changes have occurred. The frequency adjustment number K is available after a read to a microprocessor 522 via a register represented by a fly height measurement block 524. An initial frequency adjustment value Ko is saved for each head identified from a harmonic ratio fly height (HRF) clearance test at the time of manufacture of the disk drive. The servo processor present in the disk drive control unit can be used to perform the monitoring operations by microprocessor 522.

Figure 7:
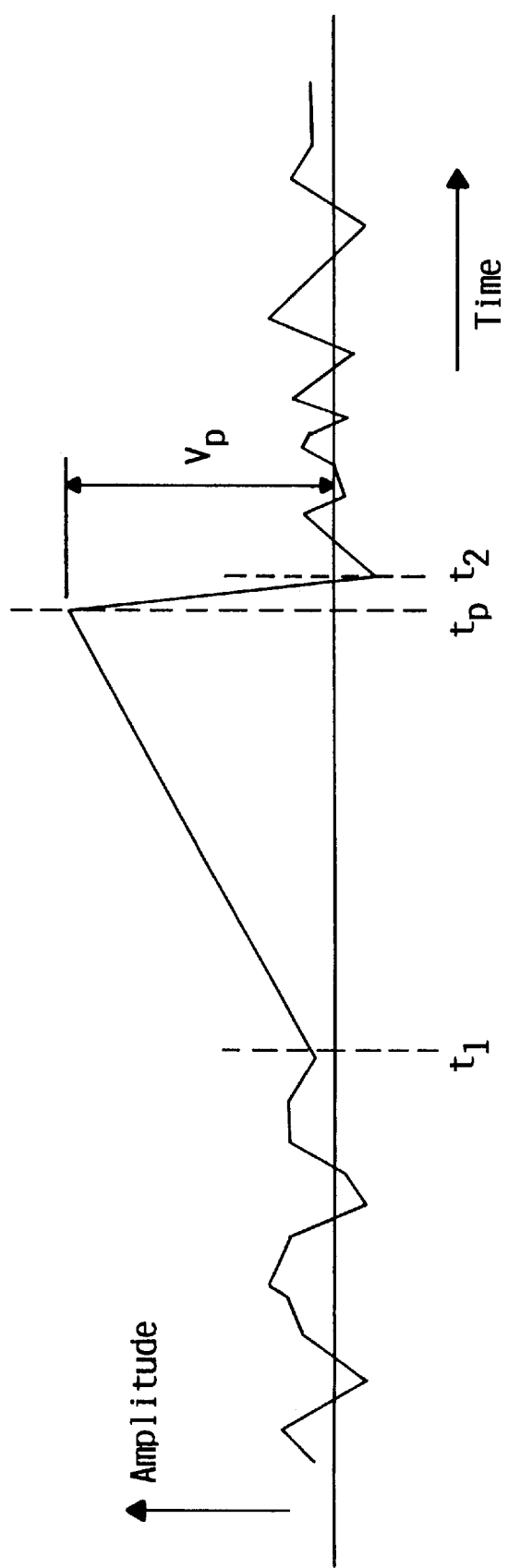
FIG. 7 is a graphical showing of HRF voltage change resulting from an asperity contact.

When a magnetic defect is present there will be no significant impact on the fly height. However, if a disk asperity is encountered, the fly height signal amplitude reveals the condition by showing a high amplitude pulse following which progressively lesser pulses or a damped response in the signal indicates a "bump signature". FIG. 7 shows the HRF output voltage change resulting from an asperity contact. FIG. 7 is a schematic of the event showing the relevant times t1, t2, and tp, as well as the peak signal voltage Vp. The maximum spacing change resulting from an asperity contact is calculated by dividing the peak voltage , Vp, by the HRF sensitivity factor, the latter being expressed as a voltage change per unit change in spacing (typically 1–10 millivolts per nanometer). The exact asperity height is found by further dividing the spacing change by the slider stiffness coefficients. The result is in a form that provides the change in the spacing at the pole faces given in vertical displacement along the line of asperity contact.

The SGT method quickly scans each surface for major defective clusters in hard disk drives. Any defective clusters found in a disk drive are then classified as to whether they were caused by mechanical contact or not. The SGT algorithm is so simple that it can be stored in the onboard disk drive microcode. It can be used in manufacturing to decide if disk drive surface damage is caused by merge-demerge.

This will cut the cost of manufacturing testing and improve the overall yield. It will replace the current manual manufacturing test systems using expensive testers. System integrators can assess if any post-manufacturing damage was caused during worldwide shipping from the original equipment manufacturer, and the end user can find out if an accidental event involving the disk drive caused any serious damage.

What is claimed is:

1. A method for the detection and classification of defects on data storage surfaces of rigid disk drives having at least one data surface which is confronted by a transducer head for writing data to and reading data form the surface comprising partitioning the disk data surface into cells including a selected number of contiguous tracks in a radial direction and defined by sector boundaries in the circumferential direction;

sub-sampling by writing and reading a selected minority of tracks distributed over the data surface to identify surface defects;

storing the number of defects that occur in each cell;

analyzing the stored defect numbers to determine whether defect clusters exist in the form of a plurality of contiguous cells each containing a number of defects exceeding a threshold number;

indexing to a second data surface of a disk drive with multiple data surfaces; sub-sampling by writing and reading selected tracks on such second data surface to identify surface defects and storing the number of defects that occur in each cell, wherein the steps of indexing to another data surface, sub-sampling and storing defects are repeated until all data surfaces have been sampled;

storing of the location and size of clusters found on each data surface which exceed a predetermined number of cells in a largest cluster table; and scanning each track within a cluster to obtain further verification of the defect status within the cluster.

2. The method of claim 1 wherein the step of analyzing includes the use of filter means for filtering data read during said sub-sampling step to eliminate isolated noise spikes and isolated defects to determine where a predetermined density of defects exist, the step of partitioning to form cells includes zones of contiguous tracks in the radial direction and single sectors in the circumferential direction and the step of storing defects is effected using a first register indicating the head or surface, a second register indicating the sector, and a third register indicating the zone of the defect.

3. Apparatus for detection and classification of defects on a data storage surface of a rigid disk drive having at least one data surface on which data is stored on concentric tracks and which is confronted by a transducer head for writing data to and reading data from the confronting data surface comprising means for partitioning the disk surface into cells including a plurality of contiguous tracks in a radial direction and defined by sector boundaries in the circumferential direction;

subsampling means for writing and reading every Nth data track on the data surface to identify surface defects;

storage means for recording the occurrence of surface defects by cell location;

analyzing means including a first test for determining whether the total number of defects on the data surface exceeds a first predetermined number and a second test for determining the existence of defect clusters in the form of contiguous cells each containing a number of defects exceeding a second predetermined number.

4. The defect detection and classification apparatus of claim 3 wherein said storage means includes first register means identifying the surface where a defect occurred, second register means identifying the band of tracks where the defect occurred and third register means identifying the sector where the defect occurred.

5. The defect detection and classification apparatus of claim 3 wherein said analyzing means includes adaptive recursive median filter means for identifying defect clusters on the data surface which exceed a threshold size.

6. The defect detection and classification apparatus of claim 5 wherein said apparatus further comprises a largest cluster table which records the size and location of the defect clusters which exceed said threshold size.

7. The defect detection and classification apparatus of claim 6 wherein said largest cluster table defines each cluster by recording the disk surface, start band of tracks, end band of tracks, sector and cluster size.

8. The defect detection and classification apparatus of claim 7 wherein said rigid disk drive includes multiple data surfaces and said analyzing means causes said largest cluster table to be reviewed to establish the source of damage responsible for the largest defect clusters including collateral damage, magnetic defect or disk surface asperity.

9. In a rigid disk drive data storage device wherein a plurality of disks are rotated in unison, data is written to and read from concentric tracks on the respective disk surfaces by transducer heads which confront and fly over said respective data surfaces, and the device is operated and controlled by a device controller, apparatus for detecting and classifying defects on disk data storage surfaces comprising means for dividing each disk surface into cells including a continuous band of contiguous tracks in a radial direction and bounded by sector boundaries in the circumferential direction;

subsampling means for writing and reading periodic tracks on each data surface to identify surface defects;

storage means including register means for recording the occurrence of disk surface defects by cell location; and analyzing means for determining the number of defects on each data surface and identifying cells containing defects exceeding a predetermined number to identify defect clusters consisting of groups of contiguous cells containing defects exceeding said predetermined number.

said analyzing means includes filter means for filtering data read during said sub-sampling step to eliminate isolated noise spikes and isolated defects and determine where a predetermined density of defects exists.

10. The disk drive data storage device of claim 9 wherein said analyzing means further identifies the defect clusters on each data surface which exceed a predetermined size and records the size and location of such cluster in a largest cluster table.

11. The disk drive data storage device of claim 10 wherein the largest cluster table is analyzed to determine whether the defects indicate a magnetic defect, collateral damage or a disk surface asperity.

12. The disk drive data storage device of claim 10 wherein said filter means comprises recursive filter means for identifying the largest defect clusters on each disk surface.

13. The disk drive data storage device of claim 10 wherein the largest cluster table defines the defect cluster by recording the start band of tracks, the end band of tracks, and the sector numbers to identify cluster size and position.

* * * * *